(12) United States Patent
Shen et al.

(10) Patent No.: US 6,184,116 B1
(45) Date of Patent: Feb. 6, 2001

(54) METHOD TO FABRICATE THE MOS GATE

(75) Inventors: Yun-Hung Shen; Yu-Lun Lin, both of Taipei; Kwan-Hwa Chang, Hsin-chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/480,264

(22) Filed: Jan. 11, 2000

(51) Int. Cl.$^7$ ............................................. H01L 21/4763
(52) U.S. Cl. .................. 438/587; 438/279; 438/283; 438/585; 438/275
(58) Field of Search .................................. 438/197, 199, 438/279, 283, 587, 585, 275

(56) References Cited

U.S. PATENT DOCUMENTS

| | | | |
|---|---|---|---|
| 4,419,809 | 12/1983 | Riseman et al. | 29/571 |
| 4,931,137 | 6/1990 | Sibuet | 156/656 |
| 5,202,272 | 4/1993 | Hsieh et al. | 437/29 |
| 5,593,813 | 1/1997 | Kim | 430/312 |
| 5,663,590 | 9/1997 | Kapoor | 257/529 |
| 5,667,632 | 9/1997 | Burton et al. | 438/570 |
| 5,705,414 | 1/1998 | Lustig | 437/41 GS |
| 5,734,185 | 3/1998 | Iguchi et al. | 257/336 |
| 5,736,435 | 4/1998 | Venkatesan et al. | 438/151 |
| 5,866,934 | * 2/1999 | Kadosh et al. | 257/368 |
| 5,916,821 | 6/1999 | Kerber | 438/696 |
| 5,923,981 | 7/1999 | Qian | 438/284 |
| 5,950,091 | * 9/1999 | Fulford, Jr. et al. | 438/303 |
| 6,066,534 | * 5/2000 | Son | 438/299 |
| 6,124,174 | * 9/2000 | Gardner et al. | 438/303 |

* cited by examiner

*Primary Examiner*—Long Pham
(74) *Attorney, Agent, or Firm*—George O. Saile; Stephen B. Ackerman; Rosemary L. S. Pike

(57) ABSTRACT

A new method for forming a feature, such as a gate electrode, having a feature size, or a line width, controlled by spacer width and not limited by photolithographic resolution is described. A dielectric stack is provided on the surface of a semiconductor substrate. The dielectric stack is etched away where it is not covered by a mask wherein the remaining dielectric stack has a width equal to the spacing between two of gate electrodes to be formed. A gate oxide layer is grown on the surface of the semiconductor substrate not covered by the dielectric stack. A polysilicon layer is deposited overlying the gate oxide layer and the dielectric stack. The polysilicon layer is etched back to leave spacers on the sidewalls of the dielectric stack. A dielectric layer is deposited overlying the substrate and polished back whereby an upper portion of the dielectric stack and the spacers are polished away. The remaining dielectric layer and the dielectric stack ar removed whereby the spacers remain forming narrow gate electrodes having the gate oxide layer thereunder to complete fabrication of gate electrodes in the manufacture of an integrated circuit device. This process can be integrated with a conventional lithographic process for forming wide gate electrodes as well.

34 Claims, 8 Drawing Sheets

METHOD TO FABRICATE THE MOS GATE

BACKGROUND OF THE INVENTION (1) Field of the Invention

The present invention relates to the fabrication of integrated circuit devices, and more particularly, to a method of forming a MOS gate electrode having a width not limited by photolithography resolution in the fabrication of integrated circuits.

(2) Description of the Prior Art

In the fabrication of integrated circuits, photolithography and etching are used to form structures such as polysilicon gates, word lines, bit lines, local oxidation of silicon (LOCOS), shallow trench isolation (STI), and the like. A photoresist material is coated over the layer or layers to be etched. The photoresist material is exposed to actinic light through a mask, then developed to form the photoresist mask for etching the underlying layer or layers. Using optical lithography, a resolution as small as 0.13 microns can be achieved. For smaller feature sizes, electron beam or X-ray lithography is necessary. However, these types of photolithography are expensive and time-consuming. It is desired to find a way to achieve a controllable gate electrode having a width not limited by photolithographic resolution.

U.S. Pat. No. 5,597,764 to Venkatesan et al teaches a method of forming a self-aligned gate within a recess. U.S. Pat. No. 5,734,185 to Ignuchi et al discloses a method of forming a polysilicon gate between dielectric spacers. U.S. Pat. No. 5,667,632 to Burton et al teaches forming and removing a dielectric spacer and forming a polysilicon gate within the spacer recess. U.S. Pat. No. 5,202,272 to Hsieh et al shows a gate process where a polysilicon layer is etched to form a spacer. There is a silicon nitride layer over the spacer. U.S. Pat. No. 4,419,809 to Riseman et al also discloses a poly spacer method including multiple oxidations and a masked etching process. U.S. Pat. No. 4,931,137 to Sibuet teaches forming poly spacers on a block which is then removed to leave poly gates. U.S. Pat. No. 5,593,813 to Kim shows a microscopic patterning process. U.S. Pat. No. 5,705,414 to Lustig shows a poly spacer on a stepped TEOS layer used as a mask to etch an underlying poly layer. U.S. Pat. No. 5,916,821 to Kerber teaches silicon nitride spacers on TEOS as a mask to etch a poly layer. U.S. Pat. No. 5,923,981 to Qian teaches spacers used as a mask to etch poly. U.S. Pat. No. 5,663,590 to Kapoor shows a process where metal spacers are used to connect overlying metal lines.

SUMMARY OF THE INVENTION

Accordingly, it is a primary object of the invention to provide an effective and very manufacturable process for forming structures having small line width feature sizes in the fabrication of integrated circuits.

It is a further object of the invention to form MOS gate electrodes having small line width feature sizes.

A still further object of the invention is to form MOS gate electrodes having small line width feature sizes not limited by photolithographic resolution.

Yet another object of the invention is to form MOS gate electrodes having a line width controlled by spacer width.

Yet another object is to form a feature, such as a gate electrode, having a feature size, or a line width, controlled by spacer width and not limited by photolithographic resolution.

A further object is to integrate the formation of features having small line widths not limited by photolithographic resolution with the formation of features using conventional photolithographic processes.

In accordance with the objects of the invention, a new method for forming a feature, such as a gate electrode, having a feature size, or a line width, controlled by spacer width and not limited by photolithographic resolution is achieved. A dielectric stack is provided on the surface of a semiconductor substrate. The dielectric stack is etched away where it is not covered by a mask wherein the remaining dielectric stack has a width equal to the spacing between two of the gate electrodes to be formed. A gate oxide layer is grown on the surface of the semiconductor substrate not covered by the dielectric stack. A polysilicon layer is deposited overlying the gate oxide layer and the dielectric stack. The polysilicon layer is etched back to leave spacers on the sidewalls of the dielectric stack. A dielectric layer is deposited overlying the substrate and polished back whereby an upper portion of the dielectric stack and spacers are polished away. The remaining dielectric layer and the dielectric stack are removed whereby the spacers remain forming gate electrodes having the gate oxide layer thereunder to complete fabrication of gate electrodes in the manufacture of an integrated circuit device.

Also, in accordance with the objects of the invention, a process for integrating the formation of features having small line widths not limited by photolithographic resolution with the formation of features using conventional photolithographic processes is achieved. A dielectric stack is provided on the surface of a semiconductor substrate. The dielectric stack is etched away where it is not covered by a mask wherein the remaining dielectric stack has a width equal to the spacing between two of the narrow gate electrodes to be formed. A gate oxide layer is grown on the surface of the semiconductor substrate not covered by the dielectric stack. A polysilicon layer is deposited overlying the gate oxide layer and the dielectric stack. A first mask is formed over the polysilicon layer where wide gate electrodes are to be formed. The polysilicon layer not covered by the first mask is etched back to leave spacers on the sidewalls of the dielectric stack. Thereafter, the first mask is removed. A dielectric layer is deposited overlying the substrate and polished back whereby an upper portion of the dielectric stack and the spacers are polished away. The remaining dielectric layer and dielectric stack are removed whereby the spacers remain forming narrow gate electrodes having the gate oxide layer thereunder. A second mask is formed covering the narrow gate electrodes and forming a pattern over the polysilicon layer for forming wide gate electrodes. The polysilicon layer not covered by the second mask is patterned to form wide gate electrodes to complete integration of the fabrication of both narrow and wide gate electrodes in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
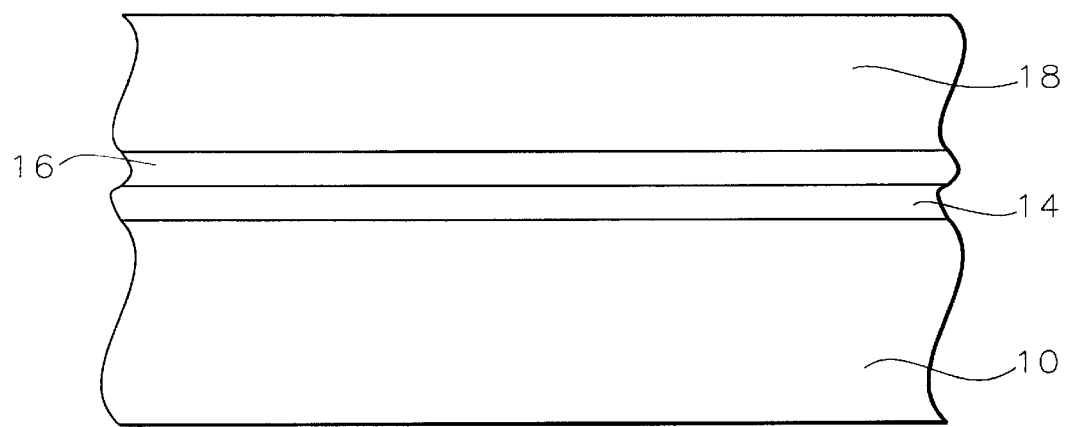
FIGS. 1 through 9 are cross-sectional representations of a first preferred embodiment of the present invention.

The process of the present invention can be used in any application where small feature sizes are desired. The process can be used to form bit lines, word lines, polysilicon gate electrodes, and the like. The drawing FIGS. 1–9 illustrate the process of the invention in making a polysilicon gate electrode. It will be appreciated by those skilled in the art that the process of the invention can be used to make any structure where lithography and etching are used to form the structure and where small feature sizes are needed.

Also, FIGS. 11–15 illustrate a second preferred embodiment of the present invention in which the process for forming small feature sizes described in reference to FIGS. 1–9 is integrated with a process for also forming larger feature sizes using conventional photolithography processes.

The first preferred embodiment of the invention will now be described with reference to FIGS. 1–9. Referring now more particularly to FIG. 1, there is shown a semiconductor substrate 10. A thin silicon oxide layer 14 is grown on the surface of the substrate to a thickness of between about 50 and 100 Angstroms. A silicon nitride layer 16 is deposited over the thin silicon oxide layer 14 to a thickness of between about 200 and 500 Angstroms. This silicon nitride layer may be a thermal silicon nitride or may be deposited, for example, by plasma enhanced chemical vapor deposition (PECVD). Next, a third dielectric layer of tetraethoxy silane (TEOS) oxide 18 is deposited over the silicon nitride layer 16 to a thickness of between about 2000 and 3000 Angstroms.

Layer 14 is a protective layer for the silicon substrate and serves as an etch stop layer. This layer may be a thin thermal oxide or oxynitride, for example. Layers 16 and 18 are of different materials than layer 14 so that the etch will stop at this layer. Layer 16 may be omitted. Layer 18 may be TEOS or borophospho-TEOS (BPTEOS). If layer 16 is omitted, layer 18 may be BPTEOS.

Figure 2:
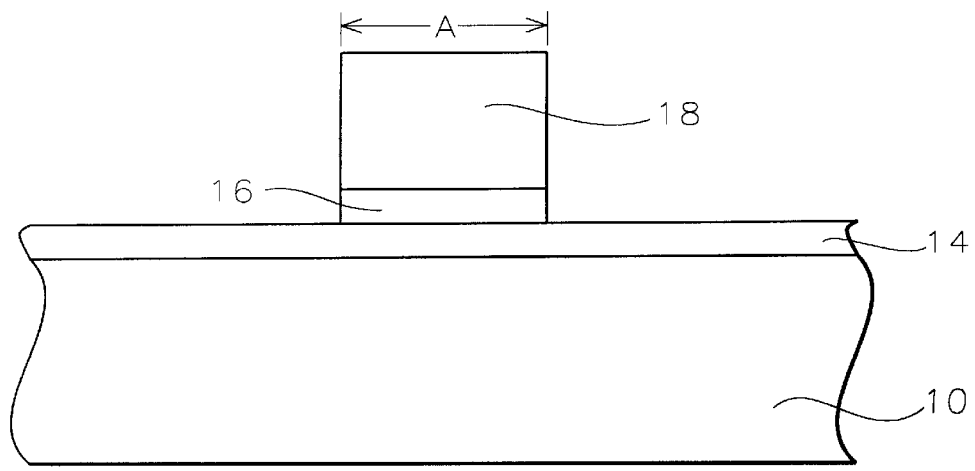

The dielectric stack is patterned, as shown in FIG. 2, with an etch stop at the thin silicon oxide layer 14. The width A of the dielectric stack should be the desired spacing between gate electrodes.

Figure 3:
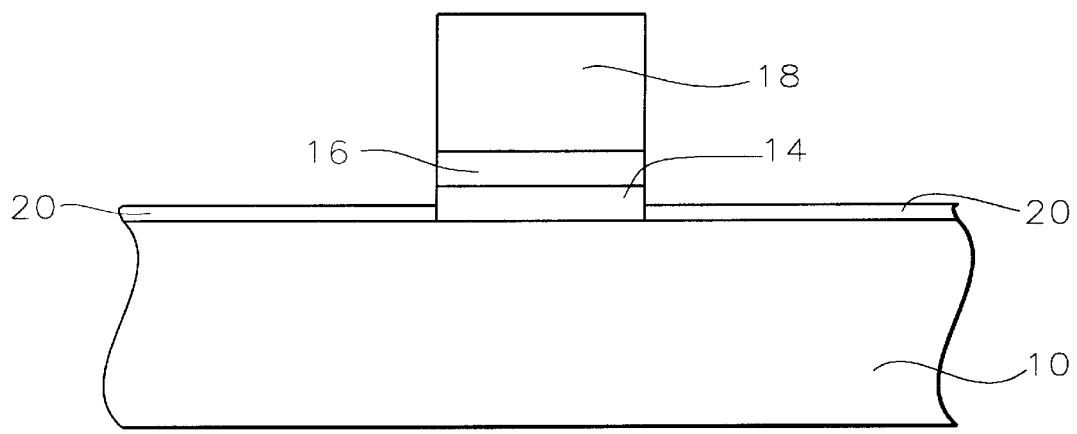

Referring now to FIG. 3, the thin silicon oxide layer 14 is stripped using a wet etch process. This stripping process will not damage the underlying silicon substrate surface. For example, the wet etching recipe may be a solution of hydrofluoric acid (HF) in the ratio of 50:1 for about 1 to 2.5 minutes.

A gate oxide layer 20 is grown on the surface of the substrate to a thickness of between about 10 and 20 Angstroms. Because the silicon oxide layer 14 was stripped using a wet etch rather than a plasma etch process, the quality of the gate oxide layer 20 is good.

Figure 4:
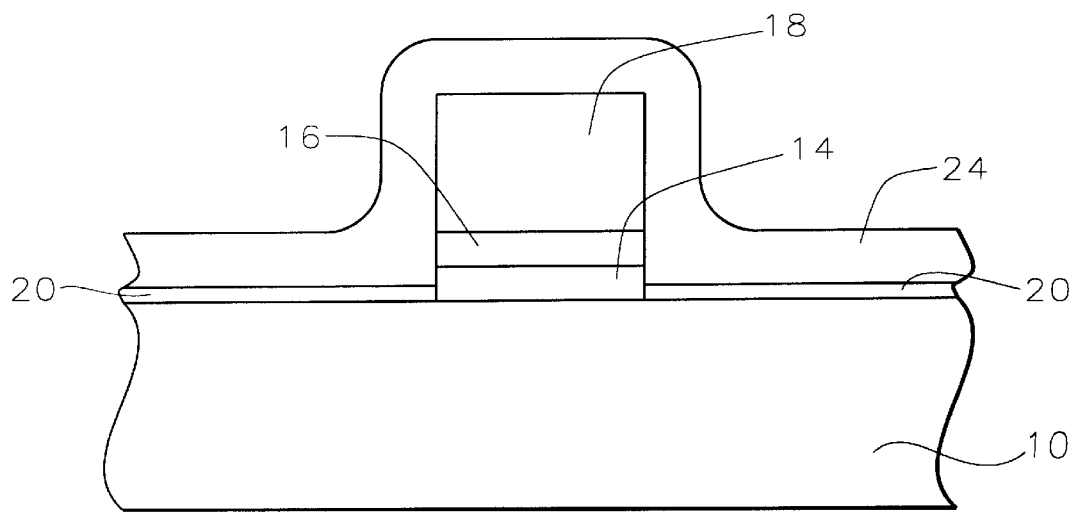

Referring now to FIG. 4, a thin polysilicon layer 24 is deposited over the surface of the gate oxide layer and the dielectric stack to a thickness of between about 700 and 3000 Angstroms, depending on the final gate width desired.

Figure 5:
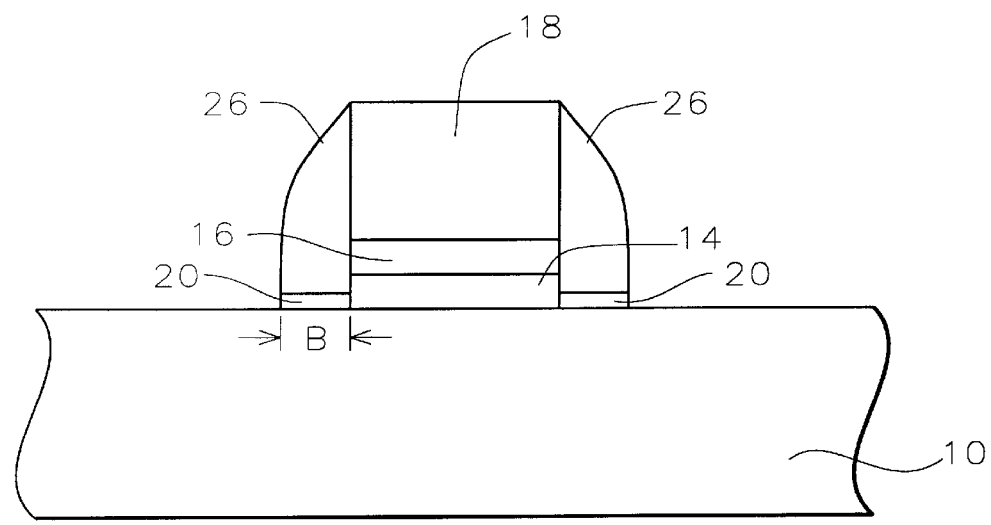

The polysilicon layer 24 is etched back using a dry etching process to leave polysilicon spacers 26 on the sidewalls of the dielectric stack, as shown in FIG. 5. For example, etching gases such as $Cl_2$, HBr, or $He/O_2$ may be used. The gate oxide layer 20 not covered by the polysilicon spacers 26 is also removed. The polysilicon spacers 26 have a width B of between about 500 and 2500 Angstroms, and as small as about 300 Angstroms.

Figure 6:
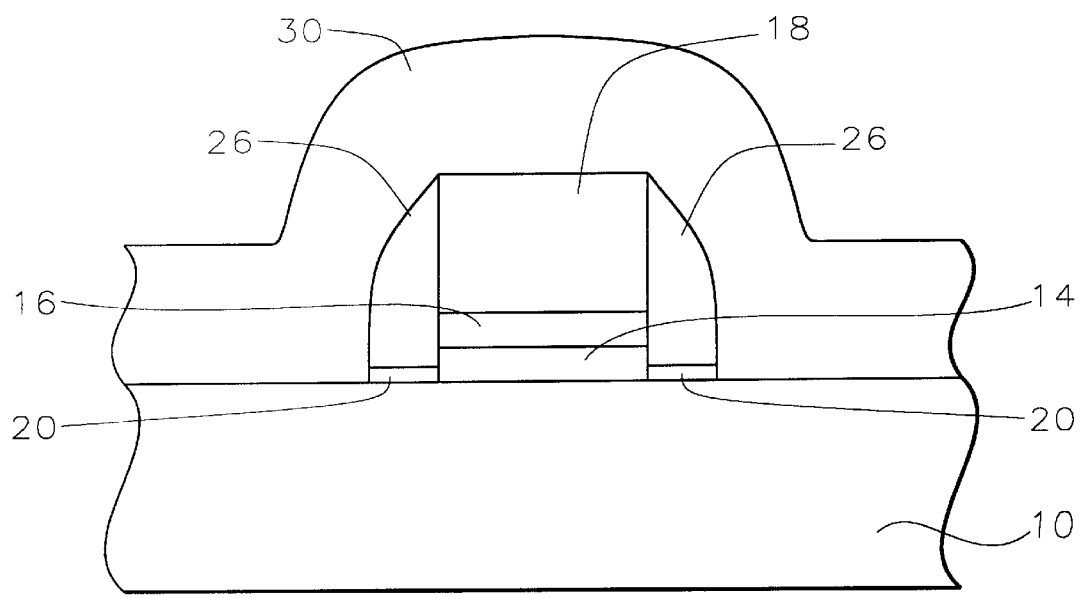

Referring now to FIG. 6, a layer a TEOS oxide 30 is deposited over the substrate to a thickness of between about 2000 and 3000 Angstroms. This layer should comprise the same material as the top layer 18 of the dielectric stack.

Figure 7:
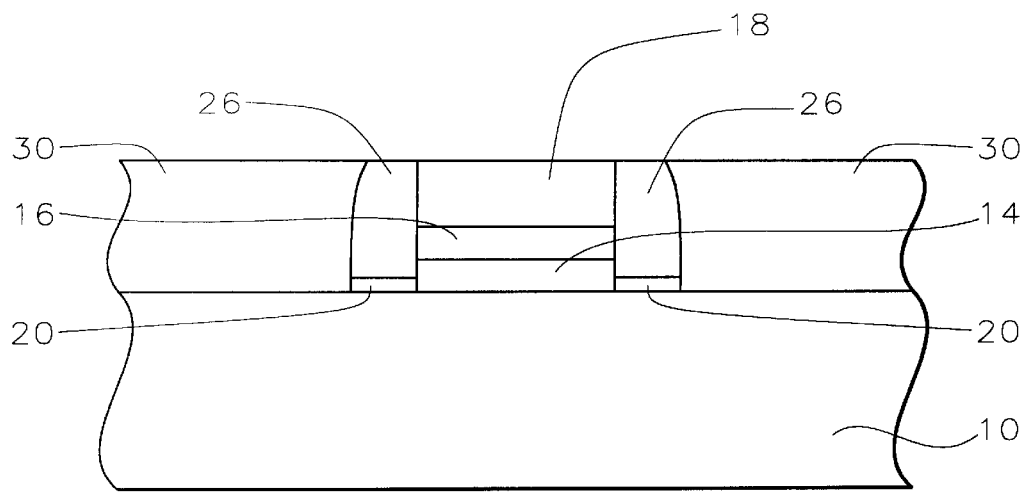

The TEOS layer 30 is polished back or etched back, for example by chemical mechanical polishing (CMP) below the surface of the dielectric stack, as illustrated in FIG. 7. About ⅓ of the stack, or about 400 to 600 Angstroms is etched back.

Figure 8:
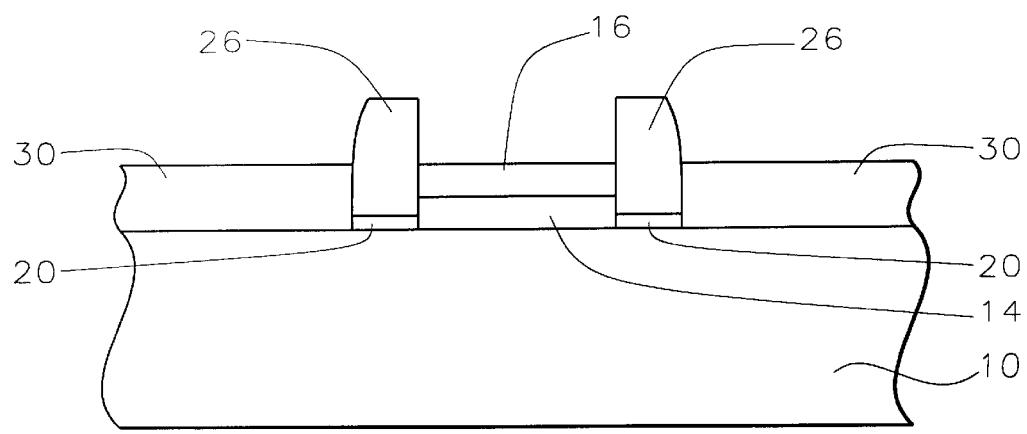

Referring now to FIG. 8, the TEOS layers 30 and 18 are stripped using a wet etch, for example a buffered oxide etch (BOE) at 10:1.

Figure 9:
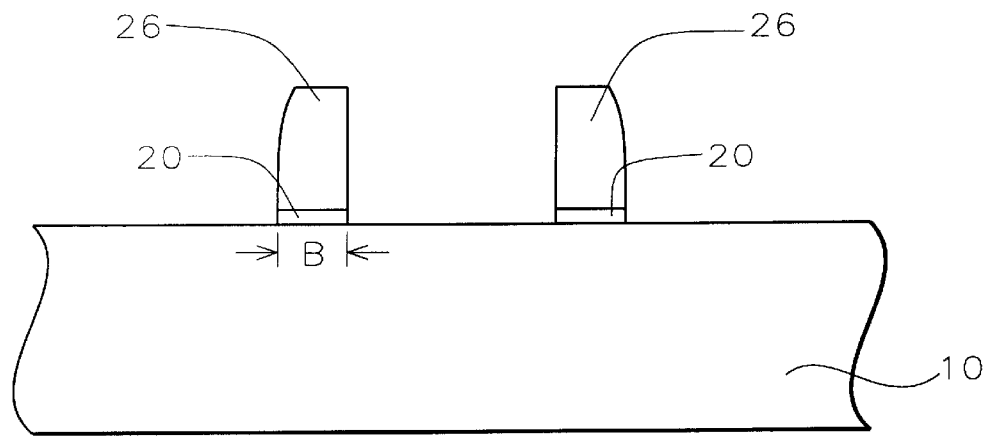

The remaining TEOS layer 30, the silicon nitride layer 16 and the thin silicon oxide layer 14 are stripped using a dry etch, as shown in FIG. 9. Remaining are the gate electrodes 26 having width B. The width B of the gate electrode is controlled by the width of the polysilicon spacer. It is not limited by photolithographic resolution, but can be as small as 300 to 800 Angstroms or 0.3 to 0.8 microns. The polish back step is essential to form a usable gate structure having no top corner.

Figure 10:
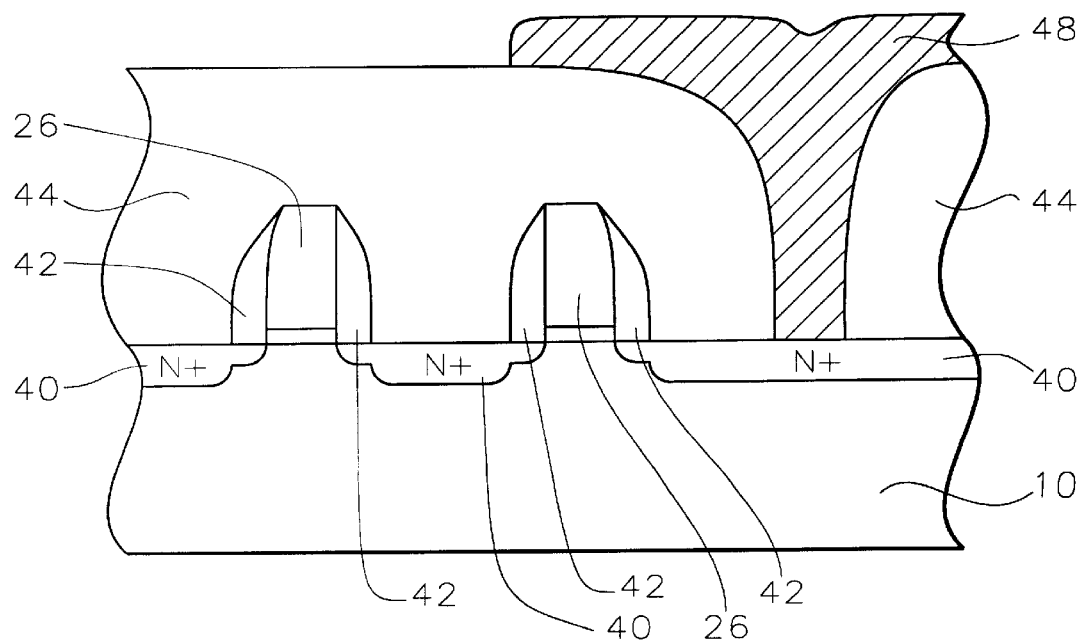
FIG. 10 is a cross-sectional representation of a completed integrated circuit device fabricated according to the first embodiment process of the present invention.

Processing continues as is conventional in the art. If, as illustrated in the drawing figures, gate electrodes have been fabricated by the process of the invention, source and drain regions 40 may be formed as shown in FIG. 10, interlevel dielectric 44 deposited and electrical contacts 48 completed, as is conventional. If the process of the invention is used to fabricate word lines or bit lines, passivation and further metallization may be provided as desired.

The process of the invention can also be used to integrate both very narrow and wide gate fabrication. The narrowest gate width is controlled by the polysilicon spacer width, using the process described hereinabove. The wide polysilicon lines are formed using conventional photolithography. This second preferred embodiment of the invention will be described with reference to FIGS. 11–15.

Figure 11:
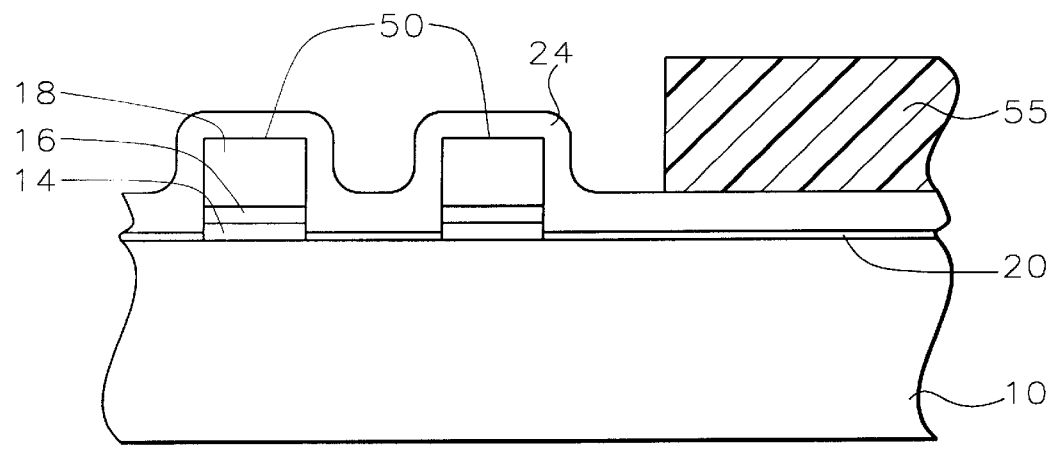
FIGS. 11 through 15 are cross-sectional representations of a second preferred embodiment of the present invention.

For example, as illustrated in FIG. 11, dielectric stacks 50 are formed using the process of the invention described above and illustrated in FIGS. 1–3. The dielectric stacks are formed over those portions of the substrate where narrow features such as gate electrodes are to be formed. Next, as in FIG. 4, the thin polysilicon layer 24 is deposited over the gate oxide layer 20 and the dielectric stacks 50.

Figure 12:
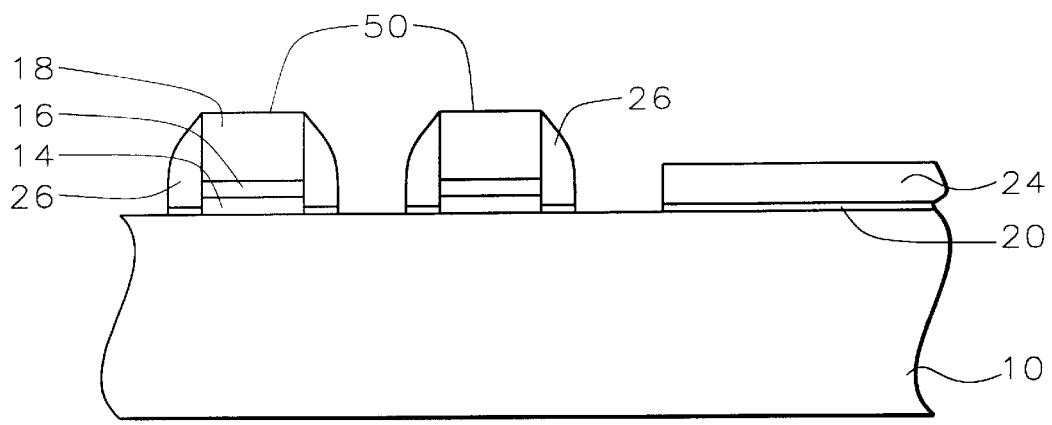

Then, a photoresist mask 55 is formed over the portion of the substrate where wide features such as polysilicon gates are to be formed. The polysilicon layer 24 is etched back, as shown in FIG. 12, using a dry etching process to leave polysilicon spacers 26 on the sidewalls of the dielectric stacks 50. This etching process is the same as that described above in reference to FIGS. 4 and 5. The polysilicon 24 covered by the photoresist mask 55 is protected from the etching. After etching, the mask 55 is removed.

Figure 13:
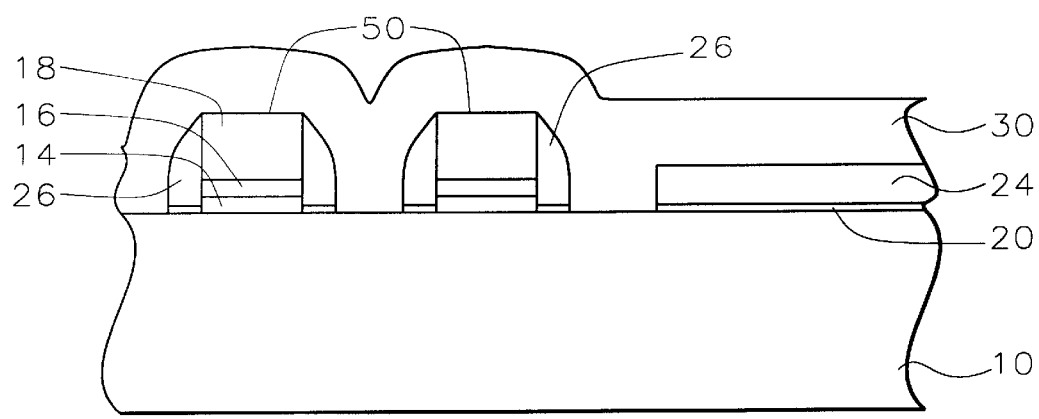
Figure 14:
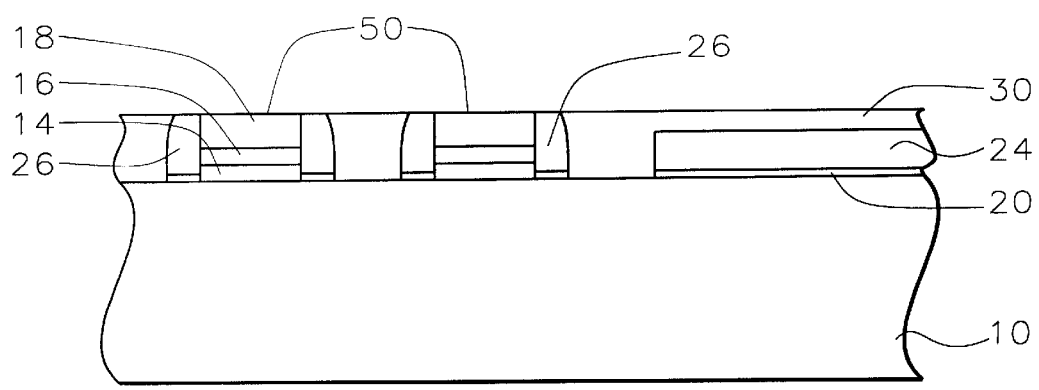

Referring now to FIG. 13, a layer a TEOS oxide 30 is deposited over the substrate to a thickness of between about 2000 and 3000 Angstroms. This layer should comprise the same material as the top layer 18 of the dielectric stack. The TEOS layer 30 is polished back or etched back, for example by chemical mechanical polishing (CMP) below the surface of the dielectric stack, as illustrated in FIG. 14. About ⅓ of the stack, or about 400 to 600 Angstroms is etched back, as above. This film 30 is essential to protecting the gate oxide and the silicon substrate.

The TEOS layers 30 and 18, the silicon nitride layer 16 and the thin silicon oxide layer 14 are stripped using wet and dry etches, as detailed above in reference to FIGS. 8 and 9. Remaining are the gate electrodes 26 having width B, shown in FIG. 15. The width B of the gate electrode is controlled by the width of the polysilicon spacer. It is not limited by photolithographic resolution, but can be as small as 300 to 800 Angstroms or 0.3 to 0.8 microns.

Figure 15:
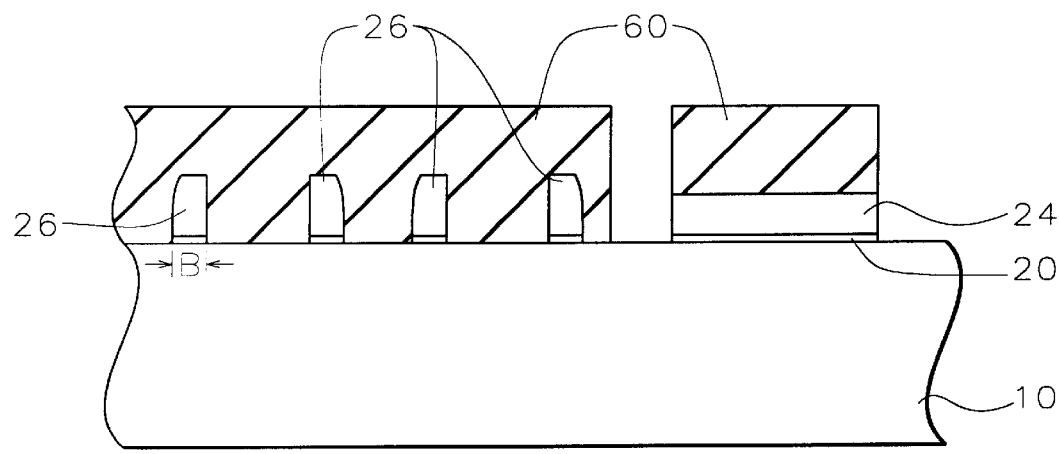

A second photoresist mask 60 is formed over the substrate, completely covering the narrow polysilicon gates 26. The mask 60 is used to pattern the polysilicon 24 to form wide polysilicon lines, as shown in FIG. 15. In this way, the method of forming narrow width features can be integrated with forming wide features as well.

Figure 16:
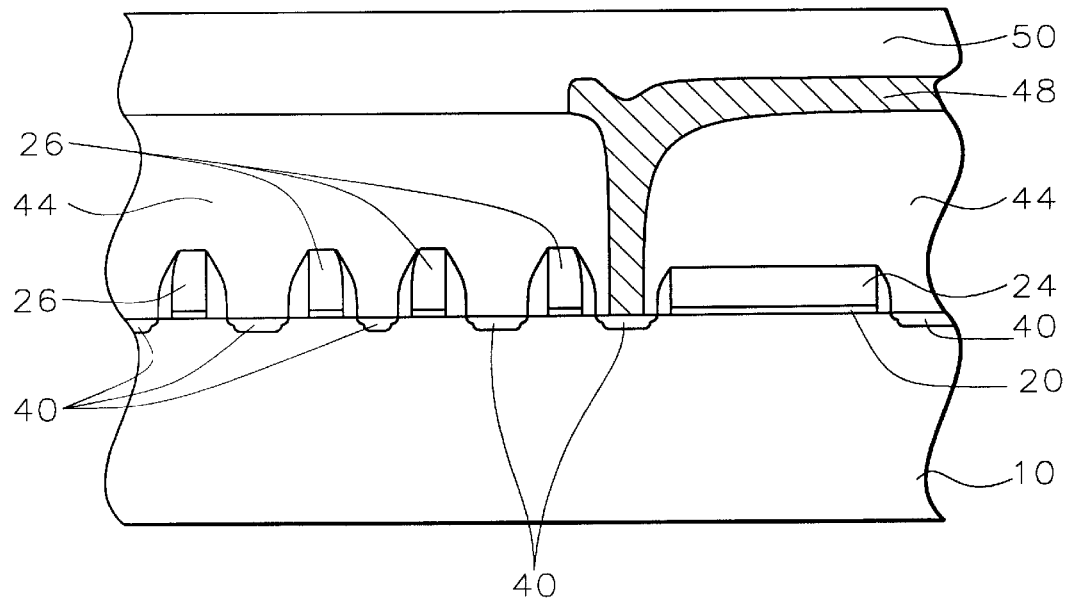
FIG. 16 is a cross-sectional representation of a completed integrated circuit device fabricated according to the second embodiment process of the present invention.

Processing continues as is conventional in the art and as described with reference to FIG. 10 to complete the integrated circuit device. For example, as illustrated in FIG. 16, source and drain regions 40 may be formed, interlevel dielectric 44 deposited and electrical contacts 48 completed, as is conventional. If the process of the invention is used to fabricate word lines or bit lines, passivation and further metallization may be provided as desired. Or, a passivation layer 50 may be deposited to complete the integrated circuit device.

The present invention provides a process for lithography and etching which supports feature sizes which are not limited by the resolution of the lithography process. Feature size is controlled by the width of a polysilicon spacer. The process of the invention can be used in any application where small feature sizes are desired. Additionally, the process of the invention for forming small feature sizes can be integrated with the formation of larger feature sizes formed by conventional lithography processes.

While the invention has been particularly shown and described with reference to the preferred embodiments thereof, it will be understood by those skilled in the art that various changes in form and details may be made without departing from the spirit and scope of the invention.

What is claimed is:

1. A method of fabricating gate electrodes in the manufacture of an integrated circuit device comprising:
    providing a dielectric stack on the surface of a semiconductor substrate;
    etching away said dielectric stack where it is not covered by a mask wherein remaining said dielectric stack has a width equal to the spacing between two of planned said gate electrodes;
    growing a gate oxide layer on the surface of said semiconductor substrate not covered by said dielectric stack;
    depositing a polysilicon layer overlying said gate oxide layer and said dielectric stack;
    etching back said polysilicon layer to leave spacers on the sidewalls of said dielectric stack;
    depositing a dielectric layer overlying said dielectric stack and said spacers;
    polishing back said dielectric layer whereby upper portions of said dielectric stack and said spacers are polished away; and
    removing remaining said dielectric layer and said dielectric stack whereby said spacers remain forming said gate electrodes having said gate oxide layer thereunder to complete fabrication of said gate electrodes in the manufacture of said integrated circuit device.

2. The method according to claim 1 wherein said step of providing said dielectric stack comprises:
    depositing a layer of silicon oxide on the surface of said semiconductor substrate;
    depositing a layer of silicon nitride overlying said silicon oxide layer; and
    depositing a layer of tetraethoxysilane (TEOS) oxide overlying said silicon nitride layer.

3. The method according to claim 1 wherein said step of providing said dielectric stack comprises:
    depositing a layer of silicon oxynitride on the surface of said semiconductor substrate;
    depositing a layer of silicon nitride overlying said silicon oxynitride layer; and
    depositing a layer of tetraethoxysilane (TEOS) oxide overlying said silicon nitride layer.

4. The method according to claim 1 wherein said step of providing said dielectric stack comprises:
    depositing a layer of silicon oxide on the surface of said semiconductor substrate; and
    depositing a layer of borophospho-TEOS oxide overlying said silicon oxide layer.

5. The method according to claim 1 wherein said step of providing said dielectric stack comprises:
    depositing a layer of silicon oxynitride on the surface of said semiconductor substrate; and
    depositing a layer of borophospho-TEOS oxide overlying said silicon oxynitride layer.

6. The method according to claim 1 wherein said gate oxide layer has a thickness of between about 10 and 50 Angstroms.

7. The method according to claim 1 wherein said polysilicon layer has a thickness of between about 700 and 3000 Angstroms.

8. The method according to claim 1 wherein said dielectric layer comprises TEOS oxide deposited to a thickness of between about 2000 and 3000 Angstroms.

9. The method according to claim 1 wherein said dielectric layer comprises BPTEOS oxide deposited to a thickness of between about 2000 and 3000 Angstroms.

10. The method according to claim 1 wherein said gate electrodes have a width of between about 500 and 2500 Angstroms.

11. The method according to claim 1 wherein said gate electrodes have a width as small as about 300 Angstroms.

12. A method of fabricating gate electrodes in the manufacture of an integrated circuit device comprising:
    depositing a layer of silicon oxide on the surface of a semiconductor substrate;
    depositing a layer of silicon nitride overlying said silicon oxide layer;
    depositing a layer of tetraethoxysilane (TEOS) oxide overlying said silicon nitride layer;
    etching away said TEOS oxide layer, said silicon nitride layer, and said silicon oxide layer where they are not covered by a mask to leave a dielectric stack wherein said dielectric stack has a width equal to the spacing between two of planned said gate electrodes;
    growing a gate oxide layer on the surface of said semiconductor substrate not covered by said dielectric stack;
    depositing a polysilicon layer overlying said gate oxide layer and said dielectric stack;
    etching back said polysilicon layer to leave spacers on the sidewalls of said dielectric stack;
    depositing a dielectric layer overlying said dielectric stack and said spacers;
    polishing back said dielectric layer whereby an upper portion of said dielectric stack and said spacers are polished away; and removing remaining said dielectric layer and said dielectric stack whereby said spacers remain forming said gate electrodes having said gate oxide layer thereunder to complete fabrication of said gate electrodes in the manufacture of said integrated circuit device.

13. The method according to claim 12 wherein said silicon oxide layer has a thickness of between about 50 and 150 Angstroms.

14. The method according to claim 12 wherein said silicon nitride layer has a thickness of between about 200 and 500 Angstroms.

15. The method according to claim 12 wherein said TEOS oxide layer has a thickness of between about 2000 and 3000 Angstroms.

16. The method according to claim 12 wherein said gate oxide layer has a thickness of between about 10 and 50 Angstroms.

17. The method according to claim 12 wherein said polysilicon layer has a thickness of between about 700 and 3000 Angstroms.

18. The method according to claim 12 wherein said dielectric layer comprises TEOS oxide deposited to a thickness of between about 2000 and 3000 Angstroms.

19. The method according to claim 12 wherein said gate electrodes have a width of between about 500 and 2500 Angstroms.

20. The method according to claim 12 wherein said gate electrodes have a width as small as about 300 Angstroms.

21. A method of fabricating gate electrodes in the manufacture of an integrated circuit device comprising:

providing a dielectric stack on the surface of a semiconductor substrate;

etching away said dielectric stack where it is not covered by a mask wherein remaining said dielectric stack has a width equal to the spacing between two of planned said gate electrodes;

growing a gate oxide layer on the surface of said semiconductor substrate not covered by said dielectric stack;

depositing a polysilicon layer overlying said gate oxide layer and said dielectric stack;

etching back said polysilicon layer to leave spacers on the sidewalls of said dielectric stack wherein said spacers have a width as small as between 300 and 800 Angstroms;

depositing a dielectric layer overlying said dielectric stack and said spacers;

polishing back said dielectric layer whereby upper portions of said dielectric stack and said spacers are polished away wherein said upper portions comprise ⅓ of said dielectric stack; and removing remaining said dielectric layer and said dielectric stack whereby said spacers remain forming said gate electrodes having said gate oxide layer thereunder to complete fabrication of said gate electrodes in the manufacture of said integrated circuit device.

22. The method according to claim 21 wherein said step of providing said dielectric stack comprises:

depositing a layer of silicon oxide on the surface of said semiconductor substrate;

depositing a layer of silicon nitride overlying said silicon oxide layer; and depositing a layer of tetraethoxysilane (TEOS) oxide overlying said silicon nitride layer.

23. The method according to claim 21 wherein said step of providing said dielectric stack comprises:

depositing a layer of silicon oxynitride on the surface of said semiconductor substrate; and depositing a layer of borophospho-TEOS oxide overlying said silicon oxynitride layer.

24. The method according to claim 21 wherein said gate oxide layer has a thickness of between about 10 and 50 Angstroms.

25. The method according to claim 22 wherein said dielectric layer comprises TEOS oxide deposited to a thickness of between about 2000 and 3000 Angstroms.

26. The method according to claim 23 wherein said dielectric layer comprises BPTEOS oxide deposited to a thickness of between about 2000 and 3000 Angstroms.

27. A method of integrating the fabrication of both narrow and wide gate electrodes in the manufacture of an integrated circuit device comprising:

providing a dielectric stack on the surface of a semiconductor substrate;

etching away said dielectric stack where it is not covered by a mask wherein remaining said dielectric stack has a width equal to the spacing between two of planned said narrow gate electrodes;

growing a gate oxide layer on the surface of said semiconductor substrate not covered by said dielectric stack;

depositing a polysilicon layer overlying said gate oxide layer and said dielectric stack;

forming a first mask over said polysilicon layer where said wide gate electrodes are to be formed;

etching back said polysilicon layer not covered by said first mask to leave spacers on the sidewalls of said dielectric stack;

thereafter removing said first mask;

depositing a dielectric layer overlying said substrate;

thereafter polishing back said dielectric layer whereby upper portions of said dielectric stack and said spacers are polished away wherein said upper portions comprise about ⅓ of said dielectric stack;

removing remaining said dielectric layer and said dielectric stack whereby said spacers remain forming said narrow gate electrodes having said gate oxide layer thereunder;

forming a second mask covering said narrow gate electrodes and forming a pattern over said polysilicon layer for forming said wide gate electrodes;

patterning said polysilicon layer not covered by said second mask to form said wide gate electrodes to complete integration of said fabrication of both narrow and wide gate electrodes in the manufacture of said integrated circuit device.

28. The method according to claim 27 wherein said step of providing said dielectric stack comprises:

depositing a layer of silicon oxide on the surface of said semiconductor substrate;

depositing a layer of silicon nitride overlying said silicon oxide layer; and depositing a layer of tetraethoxysilane (TEOS) oxide overlying said silicon nitride layer.

29. The method according to claim 27 wherein said step of providing said dielectric stack comprises:

depositing a layer of silicon oxynitride on the surface of said semiconductor substrate; and depositing a layer of borophospho-TEOS oxide overlying said silicon oxynitride layer.

30. The method according to claim 27 wherein said gate oxide layer has a thickness of between about 10 and 50 Angstroms.

31. The method according to claim 27 wherein said polysilicon layer has a thickness of between about 700 and 3000 Angstroms.

32. The method according to claim 27 wherein said dielectric layer comprises TEOS oxide deposited to a thickness of between about 2000 and 3000 Angstroms.

33. The method according to claim 27 wherein said dielectric layer comprises BPTEOS oxide deposited to a thickness of between about 2000 and 3000 Angstroms.

34. The method according to claim 27 wherein said narrow gate electrodes have a width as small as between about 300 and 800 Angstroms.

* * * * *